United States Patent
Sawataishi (10) Patent No.: US 9,428,838 B2
(45) Date of Patent: Aug. 30, 2016

(54) PLASMA PROCESSING METHOD AND PLASMA PROCESSING APPARATUS

(71) Applicant: TOKYO ELECTRON LIMITED, Tokyo (JP)

(72) Inventor: Masayuki Sawataishi, Miyagi (JP)

(73) Assignee: TOKYO ELECTRON LIMITED, Tokyo (JP)

(*) Notice: Subject to any disclaimer, the term of this patent is extended or adjusted under 35 U.S.C. 154(b) by 0 days.

(21) Appl. No.: 14/242,273

(22) Filed: Apr. 1, 2014

(65) Prior Publication Data

US 2014/0299571 A1    Oct. 9, 2014

(30) Foreign Application Priority Data

Apr. 3, 2013 (JP) .................. 2013-077575

(51) Int. Cl.
| | |
|---|---|
| H01L 21/302 | (2006.01) |
| C23F 1/12 | (2006.01) |
| C23F 4/00 | (2006.01) |
| H01J 37/32 | (2006.01) |
| H01L 21/3213 | (2006.01) |

(52) U.S. Cl.
CPC . *C23F 1/12* (2013.01); *C23F 4/00* (2013.01); *H01J 37/32091* (2013.01); *H01L 21/32136* (2013.01); *H01J 2237/334* (2013.01)

(58) Field of Classification Search
CPC ........ C23F 1/12; C23F 1/44; H01L 21/3065; H01L 21/308; H01L 21/30655; H01L 21/00; H01L 21/3114; H01L 21/3111; H01L 21/32136; H01L 21/32091; H01J 37/3244
USPC ....... 438/706, 710, 712, 714, 717, 720, 721, 438/723, 736; 156/345.26, 345, 28; 216/58, 216/67, 68
See application file for complete search history.

(56) References Cited

U.S. PATENT DOCUMENTS

| | | | |
|---|---|---|---|
| 6,813,534 B2* | 11/2004 | Sui et al. ................ 700/121 |
| 7,807,574 B2* | 10/2010 | Yu et al. ................ 438/689 |
| 2007/0042603 A1* | 2/2007 | Kropewnicki et al. ....... 438/689 |
| 2008/0230519 A1* | 9/2008 | Takahashi ............... 216/64 |
| 2009/0163033 A1* | 6/2009 | Ding et al. ............. 438/716 |
| 2010/0093178 A1* | 4/2010 | Honda ................. 438/719 |
| 2011/0124134 A1* | 5/2011 | Lin et al. ............... 438/14 |
| 2011/0237084 A1* | 9/2011 | Luong ............ H01J 37/32091 438/720 |
| 2012/0244693 A1* | 9/2012 | Luong ............ H01L 21/28247 438/591 |

FOREIGN PATENT DOCUMENTS

| | | |
|---|---|---|
| JP | 11-233495 A | 8/1999 |
| JP | 2002-75967 A | 3/2002 |

* cited by examiner

*Primary Examiner* — Lan Vinh
(74) *Attorney, Agent, or Firm* — Rothwell, Figg, Ernst & Manbeck, P.C.

(57) ABSTRACT

Disclosed are a plasma processing method and a plasma processing apparatus which collectively perform etching under the same etching conditions while suppressing a shape abnormality. The multilayer film material has a polysilicon layer, a first metal layer formed on the polysilicon layer, and a hard mask layer which contains a tungsten layer formed on the first metal layer. In the method, plasma is generated by a mixed gas of a chloride-containing gas which contains a compound containing chlorine and silicon, a compound containing chlorine and boron, or a compound containing chlorine and hydrogen, a chlorine-containing gas which contains chlorine, and a processing gas which contains carbon and fluorine, and the hard mask layer is used as an etching mask so as to perform the etching from a top surface of the first metal layer to a bottom surface of the polysilicon layer.

8 Claims, 8 Drawing Sheets

| | INITIAL | COMPARATIVE EXAMPLE1 Cl₂ (80sccm) | COMPARATIVE EXAMPLE2 Cl₂/C₄F₈ (80sccm/10sccm) | EXAMPLE1 Cl₂/BCl₃/C₄F₈ (30sccm/50sccm/5sccm) |
|---|---|---|---|---|
| TUNGSTEN LAYER Top CD [nm] | 25.3 | 23.6 | 21.0 | 23.5 |
| TUNGSTEN LAYER Mid CD [nm] | 28.3 | 24.6 | 21.2 | 25.5 |
| ΔMid CD FROM INITIAL [nm] | - | 3.7 | 7.1 | 2.8 |
| BARRIER METAL LAYER Btm space CD [nm] | - | 13.9 | 21.8 | 21.8 |
| Poly Si LAYER MAX CD [nm] | - | 32.7 | 28.8 | 25.8 |
| Δ(MAX CD-Btm CD) [nm] | - | 18.8 | 6.89 | 4.0 |

FIG. 6

| | INITIAL | COMPARATIVE EXAMPLE3 Cl$_2$/BCl$_3$/C$_4$F$_8$ (80sccm/0sccm/10sccm) | EXAMPLE2 Cl$_2$/BCl$_3$/C$_4$F$_8$ (50sccm/30sccm/10sccm) | EXAMPLE3 Cl$_2$/BCl$_3$/C$_4$F$_8$ (30sccm/50sccm/10sccm) | EXAMPLE4 Cl$_2$/BCl$_3$/C$_4$F$_8$ (50sccm/30sccm/20sccm) |
|---|---|---|---|---|---|
| TUNGSTEN LAYER Top CD[nm] | 25.3 | 21.8 | 23.1 | 22.5 | 22.5 |
| TUNGSTEN LAYER Mid CD[nm] | 29.1 | 23.6 | 26.0 | 25.6 | 26.6 |
| Δ Mid CD FROM INITIAL [nm] | - | 5.5 | 3.1 | 3.5 | 2.5 |
| Δ (MAXCD-Btm CD) [nm] | - | 6.9 | 7.9 | 2.0 | 1.0 |

FIG. 7

| | INITIAL | COMPARATIVE EXAMPLE 4 Cl$_2$/BCl$_3$/C$_4$F$_8$ (80sccm/0sccm/10sccm) | EXAMPLE5 Cl$_2$/BCl$_3$/C$_4$F$_8$ (50sccm/30sccm/10sccm) | EXAMPLE6 Cl$_2$/BCl$_3$/C$_4$F$_8$ (50sccm/30sccm/5sccm) | EXAMPLE7 Cl$_2$/BCl$_3$/C$_4$F$_8$ (30sccm/50sccm/5sccm) |
|---|---|---|---|---|---|
| TUNGSTEN LAYER Top CD[nm] | 25.3 | 21.0 | 21.8 | 22.3 | 23.5 |
| TUNGSTEN LAYER Mid CD[nm] | 28.3 | 21.2 | 24.0 | 24.1 | 25.5 |
| Δ Mid CD FROM INITIAL [nm] | - | 7.1 | 4.3 | 4.2 | 2.8 |
| Δ (MAXCD-Btm CD) [nm] | - | 6.9 | 6.9 | 9.9 | 4.0 |

FIG. 8

| | INITIAL | COMPARATIVE EXAMPLE5 Cl₂/BCl₃/C₄F₈ (80sccm/0sccm/10sccm) | EXAMPLE8 Cl₂/BCl₃/C₄F₈ (60sccm/20sccm/10sccm) | EXAMPLE9 Cl₂/BCl₃/C₄F₈ (20sccm/60sccm/10sccm) | EXAMPLE10 Cl₂/SiCl₄/C₄F₈ (60sccm/20sccm/20sccm) |
|---|---|---|---|---|---|
| TUNGSTEN LAYER Top CD [nm] | 26.3 | 21.2 | 23.3 | 25.0 | 24.5 |
| TUNGSTEN LAYER Mid CD [nm] | 31.6 | 26.6 | 28.1 | 30.3 | 28.1 |
| Δ Mid CD FROM INITIAL [nm] | - | 5.0 | 3.5 | 1.3 | 3.5 |
| Δ (MAXCD-Btm CD) [nm] | - | 6.9 | 8.9 | 3.0 | 12.9 |

PLASMA PROCESSING METHOD AND PLASMA PROCESSING APPARATUS

CROSS-REFERENCE TO RELATED APPLICATIONS

This application is based on and claims priority from Japanese Patent Application No. 2013-077575, filed on Apr. 3, 2013, with the Japan Patent Office, the disclosure of which is incorporated herein in its entirety by reference.

TECHNICAL FIELD

The present disclosure relates to a plasma processing method and a plasma processing apparatus.

BACKGROUND

Conventionally, Japanese Patent Laid-Open Publication No. 2002-75967 and H11-233495 disclose a method of performing a plasma processing on a multilayer film which includes a metal layer. In the plasma processing method disclosed in Japanese Patent Laid-Open Publication No. 2002-75967, an etching processing is performed on an workpiece which includes a metal layer (a tungsten nitride layer or a titanium nitride layer) formed on a polysilicon layer, a tungsten layer formed on the metal layer, and a silicon oxide formed on the tungsten layer. The tungsten layer is etched by using the silicon oxide, and then the metal layer formed on the polysilicon layer is etched by using a mixed gas of a gas containing atoms of at least one of fluorine, chlorine and bromine, and a gas containing oxygen atoms. The polysilicon layer is etched by a chlorine gas or a hydrogen bromide gas.

In the plasma processing method disclosed in Japanese Patent Laid-Open Publication No. H11-233495, an etching processing is performed on a workpiece in which a polysilicon layer, a metal layer or a metal silicide layer, and a mask pattern are sequentially layered on a substrate. The method includes a first process of etching the metal layer or the metal silicide layer by using a gas containing fluorine, chlorine and bromine, a second process of removing an etching interference film formed on the polysilicon layer, and a third process of etching the polysilicon layer by using a gas containing chlorine.

SUMMARY

The present disclosure provides a plasma processing method which etches a multilayer film material by using a plasma processing apparatus. The plasma processing apparatus includes: a processing container which defines a processing space where plasma is generated, and a gas supply unit configured to supply a gas into the processing space. The multilayer film material has a polysilicon layer, a first metal layer formed on the polysilicon layer, and a hard mask layer which contains a tungsten layer formed on the first metal layer. In the method, plasma is generated by a mixed gas of a chloride-containing gas which contains a compound containing chlorine and silicon, a compound containing chlorine and boron, or a compound containing chlorine and hydrogen, a chlorine-containing gas which contains chlorine, and a processing gas which contains carbon and fluorine, and the hard mask layer is used as an etching mask so as to perform the etching from a top surface of the first metal layer to a bottom surface of the polysilicon layer.

The foregoing summary is illustrative only and is not intended to be in any way limiting. In addition to the illustrative aspects, embodiments, and features described above, further aspects, embodiments, and features will become apparent by reference to the drawings and the following detailed description.

DETAILED DESCRIPTION

In the following detailed description, reference is made to the accompanying drawing, which form a part hereof. The illustrative embodiments described in the detailed description, drawing, and claims are not meant to be limiting. Other embodiments may be utilized, and other changes may be made without departing from the spirit or scope of the subject matter presented here.

In the above described plasma processing method disclosed in Japanese Patent Laid-Open Publication No. 2002-75967 and H11-233495, etching is performed stepwise in order to remove or suppress reaction products generated when the polysilicon layer or the metal layer is etched, or in order to achieve uniformity of a shape, and thus it is impossible to etch collectively the polysilicon layer and the metal layer under the same etching conditions. The present technical field requires a plasma processing method and a plasma processing apparatus in which etching is collectively performed on a polysilicon layer and a metal layer under the same etching conditions while suppressing a shape abnormality.

A plasma processing method according to an aspect of the present disclosure etches a multilayer film material by using a plasma processing apparatus. The plasma processing apparatus includes: a processing container which defines a processing space where plasma is generated, and a gas supply unit configured to supply a gas into the processing space. The multilayer film material has a polysilicon layer, a first metal layer formed on the polysilicon layer, and a hard mask layer which contains a tungsten layer formed on the first metal layer. In the method, plasma is generated by a mixed gas of a chloride-containing gas which contains a compound containing chlorine and silicon, a compound containing chlorine and boron, or a compound containing chlorine and hydrogen, a chlorine-containing gas which contains chlorine, and a processing gas which contains carbon and fluorine, and the hard mask layer is used as an etching mask so as to perform the etching from a top surface of the first metal layer to a bottom surface of the polysilicon layer.

In the plasma processing method, while the first metal layer and the polysilicon layer are etched by chlorine radicals included in the chlorine-containing gas, the processing gas which contains carbon and fluorine is introduced into the processing space, thereby forming a product containing carbon as a protective film on the side wall of the polysilicon layer. This may suppress unnecessary etching of the polysilicon layer in the horizontal direction. While the first metal layer and the polysilicon layer are etched, the chloride-containing gas containing silicon, boron or hydrogen is introduced into the processing space. Thus, during generation of the chlorine radicals, silicon, boron or hydrogen included in the chloride-containing gas reacts with the fluorine radicals included in the processing gas. Accordingly, it is possible to suppress the fluorine radicals from etching the side wall of the tungsten layer included in the hard mask layer. In this manner, the shape of the mask is maintained but the shape abnormality of the material to be etched may be suppressed. Thus, it is possible to collectively perform etching under the same etching conditions while suppressing a shape abnormality.

In the plasma processing method, the first metal layer contains titanium, titanium nitride or titanium silicide, the polysilicon layer is formed on a second metal layer, and the second metal layer contains titanium, titanium nitride or titanium silicide. That is, the plasma processing method may be appropriately employed in a multilayer film structure which has already been known as a semiconductor material.

In the plasma processing method, the chloride-containing gas contains at least one of $BCl_3$, $SiCl_4$ and HCl, and the processing gas contains at least one of $CF_4$ and $C_4F_8$.

In the plasma processing method, a flow rate of the chloride-containing gas is 75.0% or less with respect to a total flow rate of the chloride-containing gas and the chlorine-containing gas. Through this configuration, it is possible to maintain an etching rate while suppressing a shape abnormality.

In the plasma processing method, a flow rate of the chloride-containing gas is 25.0% or more with respect to the total flow rate of the chloride-containing gas and the chlorine-containing gas. When the chloride-containing gas of at least 25.0% is included, a shape abnormality may be suppressed.

A plasma processing apparatus according to another aspect of the present disclosure etches a multilayer film material. The plasma processing apparatus includes: a processing container, a gas supply unit and a control unit. The processing container defines a processing space where plasma is generated. The gas supply unit is configured to supply a gas into the processing space. The control unit configured to control the gas supply unit. The multilayer film material has a polysilicon layer, a first metal layer formed on the polysilicon layer, and a hard mask layer which contains a tungsten layer formed on the first metal layer. The control unit causes plasma to be generated by a mixed gas of a chloride-containing gas which contains a compound containing chlorine and silicon, a compound containing chlorine and boron, or a compound containing chlorine and hydrogen, a chlorine-containing gas which contains chlorine, and a processing gas which contains carbon and fluorine, and causes the hard mask layer to be used as an etching mask so as to perform the etching from a top surface of the first metal layer to a bottom surface of the polysilicon layer.

The plasma processing apparatus according to another aspect of the present disclosure may exhibit the same effect as those of the plasma processing method.

According to aspects and exemplary embodiments of the present disclosure, there are provided a plasma processing method and a plasma processing apparatus which may perform collectively etching under the same etching conditions while suppressing a shape abnormality.

Hereinafter, various exemplary embodiments will be described in detail with reference to the accompanying drawings. In the respective drawings, same or corresponding parts are denoted by the same reference numerals.

Figure 1:
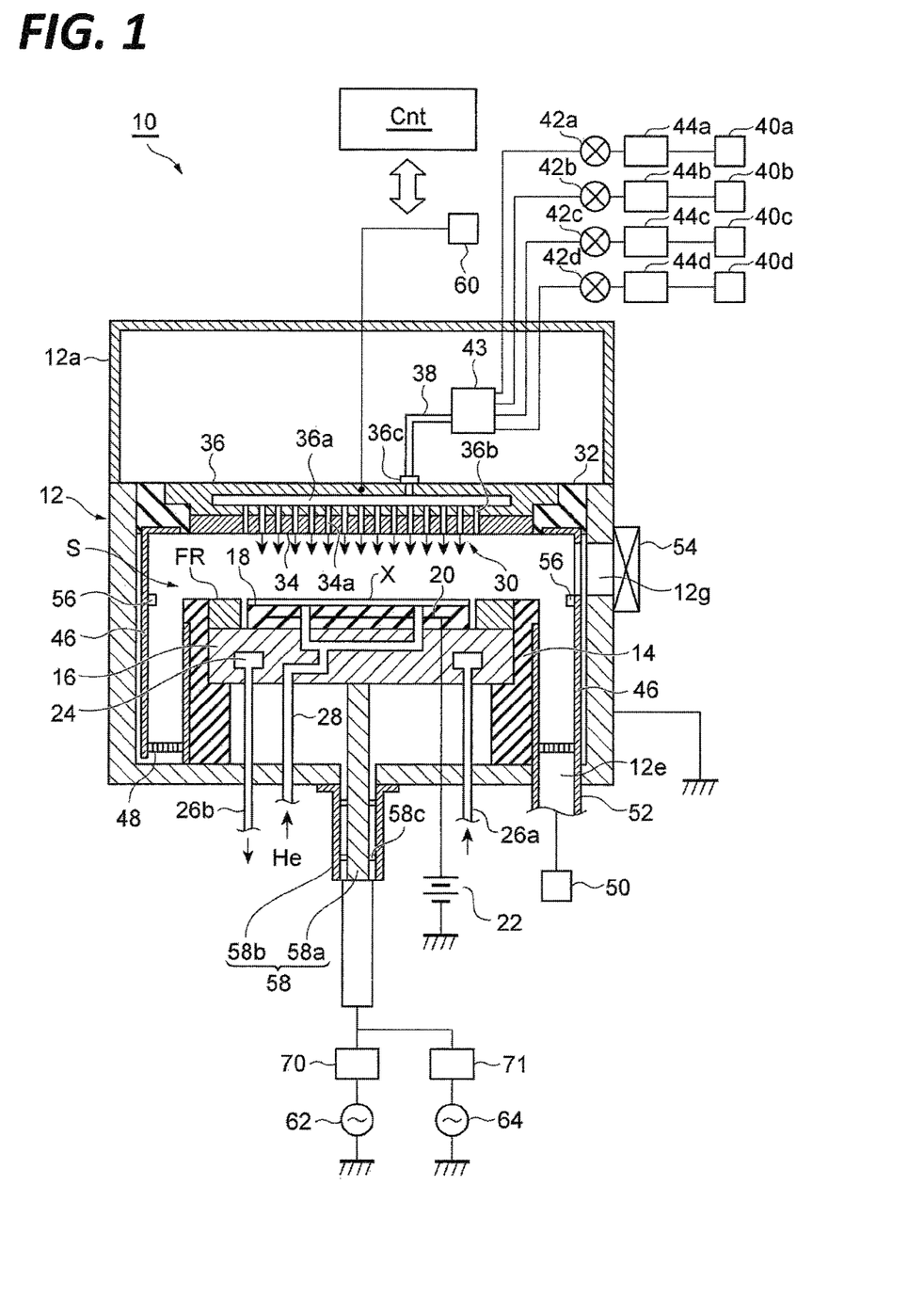
FIG. 1 is a schematic cross-sectional view illustrating a configuration of a plasma processing apparatus according to an exemplary embodiment of the present disclosure.

FIG. 1 is a schematic view illustrating the configuration of a plasma processing apparatus according to an exemplary embodiment of the present disclosure. A plasma processing apparatus 10 illustrated in FIG. 1 is a capacitively coupled parallel plate plasma etching apparatus and is provided with a substantially cylindrical processing container 12. The surface of the processing container 12 is made of, for example, anodized aluminum. The processing container 12 is frame-grounded.

A cylindrical support unit 14 made of an insulating material is disposed on the bottom of the processing container 12. The support unit 14 supports a base 16 made of, for example, a metal such as aluminum. The base 16 is provided within the processing container 12, and constitutes a lower electrode (a second electrode) in an exemplary embodiment.

An electrostatic chuck 18 is provided on the top surface of the base 16. The electrostatic chuck 18 and the base 16 constitute a mounting table according to the exemplary embodiment. The electrostatic chuck 18 has a structure where an electrode 20, which is a conductive film, is disposed between a pair of insulation layers or insulation sheets. A DC power supply 22 is electrically connected to the electrode 20. The electrostatic chuck 18 may attract and maintain a workpiece X by an electrostatic force such as, for example, Coulomb force generated by a DC voltage supplied from the DC power supply 22.

A focus ring FR is disposed on the top surface of the base 16 and around the electrostatic chuck 18. The focus ring FR is provided to improve uniformity of etching. The focus ring FR is made of a material which is appropriately selected according to a material of a layer to be etched, and may be made of, for example, silicon or quartz.

A coolant chamber 24 is provided within the base 16. The coolant chamber 24 is supplied with a coolant of a predetermined temperature, for example, cooling water, in a circulating manner, from a chiller unit provided at the outside through pipes 26a and 26b. When the temperature of the coolant circulating in this manner is controlled, the temperature of the workpiece X placed on the electrostatic chuck 18 is controlled.

A gas supply line 28 is formed in the plasma processing apparatus 10. The gas supply line 28 supplies a heat transfer gas from a heat transfer gas supply mechanism, for example, He gas, to a gap between the top surface of the electrostatic chuck 18 and the rear surface of the workpiece X.

An upper electrode 30 (a first electrode) is formed within the processing container 12. The upper electrode 30 is disposed to face the base 16, at the top side of the base 16 as a lower electrode, and the base 16 and the upper electrode 30 are provided substantially parallel to each other. A processing space S configured to perform plasma etching on the workpiece X is defined between the upper electrode 30 and the base 16 that constitutes the lower electrode.

The upper electrode 30 is supported at the upper portion of the processing container 12 through an insulative shielding member 32. The upper electrode 30 may include an electrode plate 34 and an electrode support 36. The electrode plate 34 faces the processing space S, and defines a plurality of gas ejection holes 34a. The electrode plate 34 may be made of a low resistance conductor with small Joule heat generation or a semiconductor.

The electrode support 36 detachably supports the electrode plate 34, and may be made of, for example, a conductive material such as aluminum. The electrode support 36 may have a water cooling structure. A gas diffusion chamber 36a is provided within the electrode support 36. A plurality of gas flow holes 36b which communicate with the gas ejection holes 34a extend downward from the gas diffusion chamber 36a. A gas inlet port 36c configured to guide a processing gas into the gas diffusion chamber 36a is formed in the electrode support 36, and a gas supply tube 38 is connected to the gas inlet port 36c.

Gas sources 40a to 40d are connected to the gas supply tube 38 through a splitter 43, valves 42a to 42d and mass flow controllers MFCs 44a to 44d. Instead of the MFC, an FCS may be provided. The gas source 40a is a gas source of a processing gas which contains, for example, carbon and fluorine. The processing gas containing carbon and fluorine is a gas which is represented by, for example, formula $C_xF_y$ (x, y: integer), and is a gas containing at least one of $CF_4$ and $C_4F_8$. The gas source 40b is a gas source of a chloride-containing gas which contains, for example, a compound containing chlorine and silicon, a compound containing chlorine and boron, or a compound containing chlorine and hydrogen. The chloride-containing gas is a gas containing at least one of, for example, $BCl_3$, $SiCl_4$ and HCl. The gas source 40c is a gas source of a chlorine-containing gas which contains, for example, chlorine $Cl_2$. The gas source 40d is a gas source of a gas which contains, for example, nitrogen as a purge gas or Ar as an inert gas. The gases from the gas sources 40a to 40d are supplied to the gas diffusion chamber 36a through the gas supply tube 38 and ejected to the processing space S through the gas flow holes 36b and the gas ejection holes 34a. The gas sources 40a to 40d, the valves 42a to 42d, the MFCs 44a to 44d, the splitter 43, the gas supply tube 38, and the upper electrode 30 which defines the gas diffusion chamber 36a, the gas flow holes 36b and the gas ejection holes 34a constitute a gas supply unit according to the exemplary embodiment.

The plasma processing apparatus 10 may further include a ground conductor 12a. The ground conductor 12a is a substantially cylindrical ground conductor, and is provided to extend from the side wall of the processing container 12 to a higher position than the height position of the upper electrode 30.

A deposition shield 46 is detachably formed along the inner wall of the processing container 12 in the plasma processing apparatus 10. The deposition shield 46 is also formed on the outer circumference of the support unit 14. The deposition shield 46 is configured to suppress etching by-products (deposits) from being attached on the processing container 12, and may be formed by coating a ceramic such as, for example, $Y_2O_3$ on an aluminum material.

An exhaust plate 48 is provided on the bottom side of the processing container 12 between the support unit 14 and the inner wall of the processing container 12. The exhaust plate 48 may be formed by coating a ceramic such as, for example, $Y_2O_3$, on an aluminum material. An exhaust port 12e is formed in the processing container 12 below the exhaust plate 48. An exhaust apparatus 50 is connected to the exhaust port 12e through an exhaust tube 52. The exhaust apparatus 50 includes a vacuum pump such as, for example, a turbo molecular pump and may decompress the inside of the processing container 12 to a desired degree of vacuum. A carry-in/carry-out port 12g of a workpiece X is formed in the side wall of the processing container 12 and the carry-in/carry-out port 12g is configured to be capable of being opened/closed by a gate valve 54.

A conductive member (GND block) 56 is formed on the inner wall of the processing container 12. The conductive member 56 is attached on the inner wall of the processing container 12 to be located at substantially the same height as a workpiece X in the height direction. The conductive member 56 is DC connected to ground, and exhibits an abnormal discharge prevention effect. The conductive member 56 only has to be provided in a plasma generating area, and thus its location is not limited to the location illustrated in FIG. 1. For example, the conductive member 56 may be provided at the base 16 side or in the vicinity of the upper electrode 30. That is, the conductive member 56 may be provided on the periphery of the base 16, or provided in a ring shape at the outside of the upper electrode 30.

In the exemplary embodiment, the plasma processing apparatus 10 further includes a power feeding rod 58 configured to supply a high frequency power to the base 16 which constitutes a lower electrode. The power feeding rod 58 constitutes a power feeding line according to the exemplary embodiment. The power feeding rod 58 has a coaxial double tube structure, and includes a rod-shaped conductive member 58a and a tubular conductive member 58b. The rod-shaped conductive member 58a extends substantially vertically from the outside of the processing container 12 to the inside of the processing container 12 through the bottom of the processing container 12, and the upper end of the rod-shaped conductive member 58a is connected to the base 16. The tubular conductive member 58b is provided coaxially with respect to the rod-shaped conductive member 58a to surround the periphery of the rod-shaped conductive member 58a, and is supported at the bottom of the processing container 12. Two insulating members 58c in a substantially ring shape are interposed between the rod-shaped conductive member 58a and the tubular conductive member 58b to electrically insulate the rod-shaped conductive member 58a and the tubular conductive member 58b from each other.

In the exemplary embodiment, the plasma processing apparatus 10 may further include matching units 70 and 71. The matching units 70 and 71 are connected to the lower ends of the rod-shaped conductive member 58a and the tubular conductive member 58b. A first high frequency power source 62 (a first power source unit) and a second high frequency power source 64 (a second power source unit) are connected to the matching units 70 and 71, respectively. The first high frequency power source 62 is a power source which generates a first high frequency (RF: Radio Frequency) power (a power of a first frequency) for generating plasma, and generates a high frequency power of a frequency ranging from 27 to 100 MHz, for example, a frequency of 40 MHz. For example, the first high frequency power ranges from 0 to 2000 W. The second high frequency power source 64 generates a second high frequency power (a power of a second frequency) which applies a high frequency bias power to the base 16 so as to implant ions into a workpiece X. The frequency of the second high frequency power ranges from 400 kHz to 13.56 MHz, and is, for example, 3 MHz. For example, the second high frequency power ranges from 0 to 5000 W. A DC power supply 60 is connected to the upper electrode 30 through a low pass filter. The DC power supply 60 outputs a negative DC voltage to the upper electrode 30. Through the above described configuration, two different high frequency powers may be supplied to the base 16 which constitutes the lower electrode to apply a DC voltage to the upper electrode 30.

In the exemplary embodiment, the plasma processing apparatus 10 may further include a control unit Cnt. The control unit Cnt is a computer provided with, for example, a processor, a storage unit, an input device, and a display device, and controls respective units of the plasma processing apparatus 10, for example, a power supply system, a gas supply system, a driving system, and a power supply system. The control unit Cnt allows an operator to perform, for example, input operation of a command through the input device in order to manage the plasma processing apparatus 10, and allows the display device to visually display the driving situation of the plasma processing apparatus 10. In the storage unit of the control unit Cnt, a processing recipe is stored. The processing recipe includes a control program which causes respective processings to be executed in the plasma processing apparatus 10 to be controlled by the processor, or a program which causes respective constitutional units of the plasma processing apparatus 10 to execute the processings according to processing conditions.

When the plasma processing apparatus 10 is used for etching, a workpiece X is placed on an electrostatic chuck 18. The workpiece X may include a layer to be etched and a resist mask formed on the layer. The inside of the processing container 12 is exhausted by an exhaust apparatus 50, processing gases from gas sources 40a to 40d are supplied into the processing container 12 at a predetermined flow rate, and the pressure within the processing container 12 is set in a range of, for example, 0.1 to 50 Pa.

Then, the first high frequency power source 62 supplies a first high frequency power to a base 16. The second high frequency power source 64 supplies a second high frequency power to the base 16. The DC power supply 60 supplies a first DC voltage to an upper electrode 30. Accordingly, a high frequency electric field is formed between the upper electrode 30 and the base 16 so that plasma of the processing gas supplied to a processing space S is generated. By cations or radicals generated by the plasma, the layer to be etched of the workpiece X is etched.

Figure 2A:
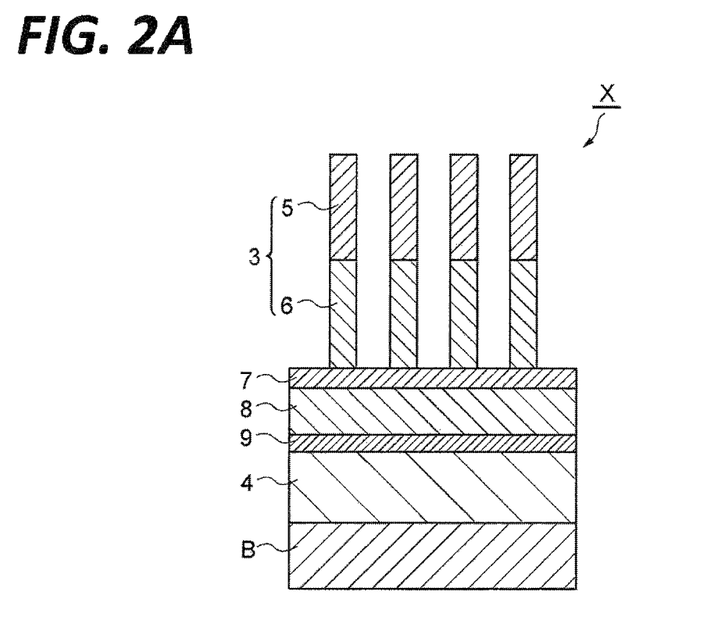
FIGS. 2A and 2B are schematic cross-sectional views illustrating an etching process.
Figure 2B:
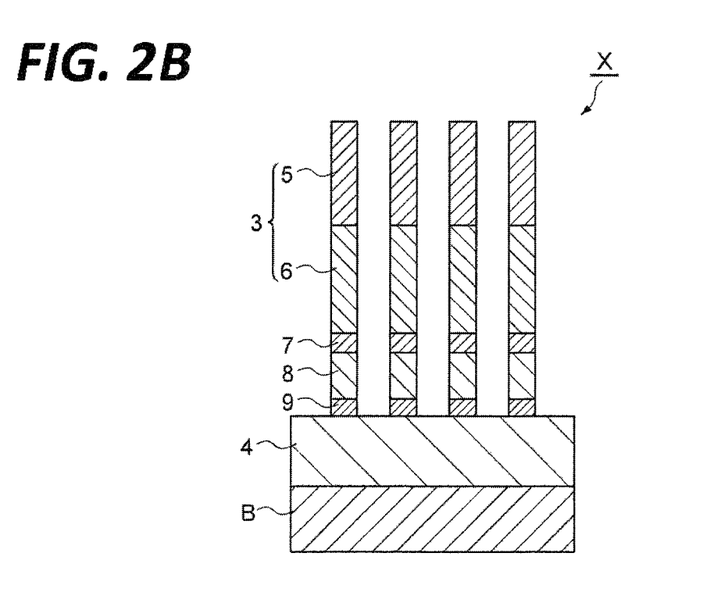

Hereinafter, referring to FIGS. 2A and 2B, an exemplary embodiment of a plasma processing method using the above described plasma processing apparatus 10 will be described. FIGS. 2A and 2B are schematic cross-sectional views illustrating an etching process. The control in the etching process illustrated in FIGS. 2A and 2B is executed by a control unit Cnt. In the plasma processing method according to the exemplary embodiment, by using the above described plasma processing apparatus 10, a structure including at least two layers of a polysilicon layer and a metal layer, as a layer to be etched, is etched collectively through a mask including tungsten to be patterned in a predetermined pattern. That is, from the top surface of the metal layer to the bottom surface of the polysilicon layer, etching is performed under the same etching conditions. Hereinafter, descriptions will be made on a case where a three-layer structure (metal layer/polysilicon layer/metal layer) including the above described two-layer structure, as a layer to be etched, is etched collectively.

As illustrated in FIGS. 2A and 2B, first, a workpiece X is prepared, and placed on an electrostatic chuck 18 of a processing container 12. As illustrated in FIG. 2A, the workpiece X is a multilayer film material in which on a substrate B, a base layer 4, a second metal layer 9, a polysilicon layer 8, and a first metal layer 7 are sequentially layered. On the first metal layer 7, a mask layer 3 having a predetermined planar shape is disposed. As for the base layer 4, for example, a layer made of polysilicon may be employed. As for the first metal layer 7 and the second metal layer 9, for example, a layer containing titanium or a titanium compound (for example, titanium nitride or titanium silicide) may be employed. On the first metal layer 7, a mask layer (a hard mask layer) 3 having a predetermined planar shape is disposed. The mask layer 3 is a so-called hard mask of which the top surface layer is made of an oxide-based layer, and forms a multi-layered structure. For example, the mask layer 3 includes a tungsten layer 6 and a silicon oxide layer 5. The mask layer 3 only has to have at least the tungsten layer 6, and may have, for example, a tungsten nitride layer or a silicon nitride layer. The mask layer 3 may be patterned by etching using, for example, a predetermined gas (e.g., a mixed gas of $CF_4$ and $O_2$). Hereinafter, in relation to the example of a workpiece X illustrated in FIG. 2A, a plasma processing method according to the exemplary embodiment will be described.

When the workpiece X illustrated in FIG. 2A is prepared, an etching process is performed. In the etching process, first, a gas supply unit supplies a mixed gas to a processing container 12, in which in the mixed gas, a chloride-containing gas ($BCl_3$, $SiCl_4$ or HCl), a chlorine-containing gas ($Cl_2$), and a processing gas ($CF_4$ or $C_4F_8$) which contains carbon and fluorine are mixed. In relation to the mixing ratio, for example, the flow rate of the chloride-containing gas only has to be 75.0% or less with respect to the total flow rate of the chloride-containing gas and the chlorine-containing gas. When the chloride-containing gas is supplied at a rate higher than 75.0%, the generation amount of chlorine radicals may be reduced, and thus, the etching rate may become extremely slow. Meanwhile, since the chloride-containing gas only has to be in a mixed state, the flow rate of the chloride-containing gas may be greater than 0%, and at least 25.0% or more with respect to the total flow rate of the chloride-containing gas and the chlorine-containing gas. The processing gas ($CF_4$ or $C_4F_8$) which contains carbon and fluorine may be supplied in a range of about 5.9% to 20.0% with respect to the total amount of the mixed gas.

Then, the control unit Cnt causes respective configuration units to generate plasma. When the plasma is generated, etching is initiated using the mask layer 3 as an etching mask. The chlorine radicals generated by the plasma sequentially etch the first metal layer 7, the polysilicon layer 8 and the second metal layer 9 and the etching thereof is terminated at a point of time when the base layer 4 is exposed as illustrated in FIG. 2B. In the etching process, from the top surface of the first metal layer 7 to the bottom surface of the second metal layer 9, etching is performed under the same etching conditions (for example, pressure/rate/composition of a mixed gas, a power to be applied by a first high frequency power source 62 and a second high frequency power source 64, and a substrate temperature).

Through the above described process, the etching of the three-layer structure (metal layer/polysilicon layer/metal layer) is terminated. In the process, since the chlorine-containing gas is mixed with the chloride-containing gas ($BCl_3$, $SiCl_4$ or HCl) and the processing gas ($CF_4$ or $C_4F_8$), abnormal shapes such as, for example, bowing, may be suppressed. Hereinafter, detailed descriptions will be made with reference to FIG. 3.

Figure 3A:
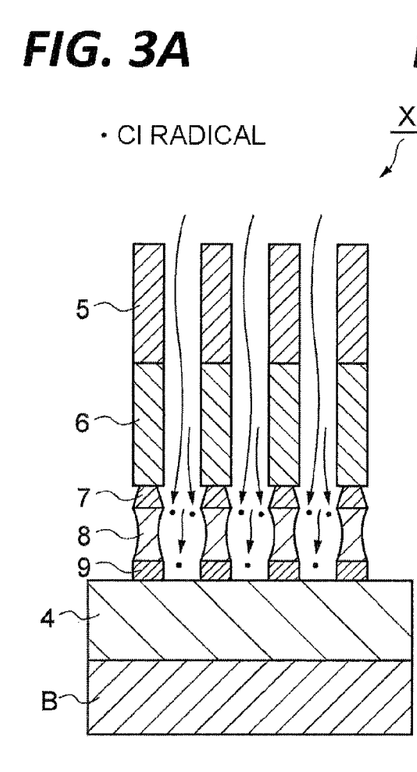
FIGS. 3A to 3C are schematic views illustrating an acting effect of a plasma processing method according to the exemplary embodiment of the present disclosure.
Figure 3B:
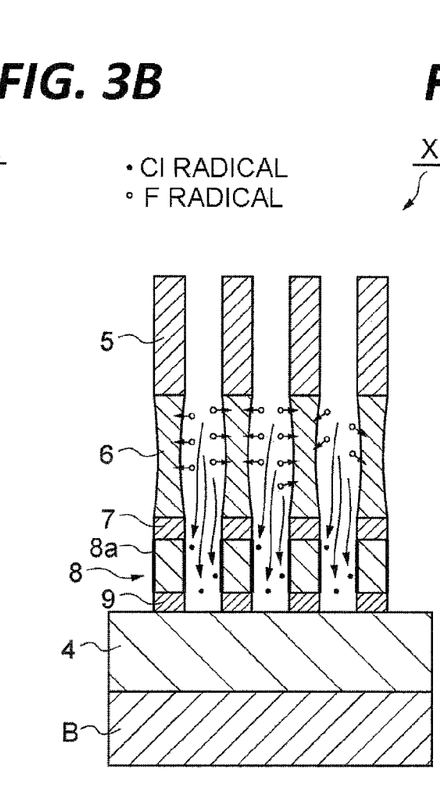
Figure 3C:
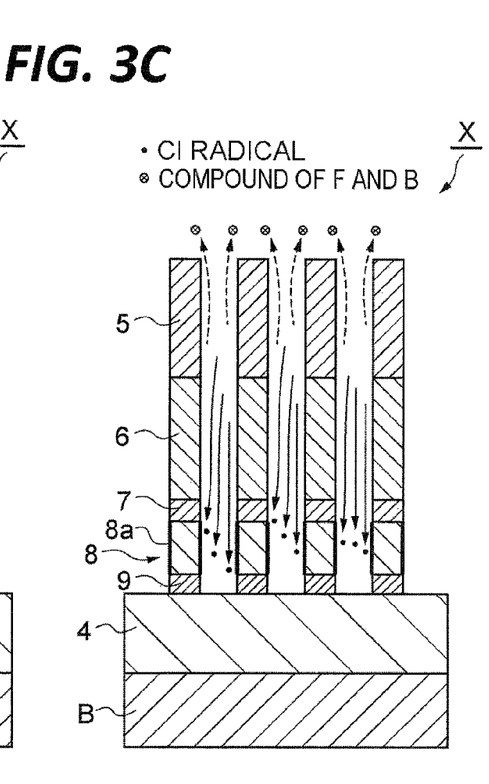

FIGS. 3A to 3C are schematic view illustrating acting effects of the method and apparatus according to the present exemplary embodiment. For comparison, Comparative Examples will be described with reference to FIGS. 3A and 3B. FIG. 3A schematically illustrates an etching process of Comparative Example 1. In Comparative Example 1, plasma etching is performed by supplying only a chlorine-containing gas ($Cl_2$). As illustrated in FIG. 3A, Cl radicals serve as an etchant for the first metal layer 7, the polysilicon layer 8 and the second metal layer 9 to perform anisotropic etching. However, when the plasma etching is performed by supplying only the chlorine-containing gas, the polysilicon layer 8 is formed into a bowing shape, and the first metal layer 7 is formed into a tapered shape, and thus, it is difficult to perform etching in accordance with design values.

FIG. 3B schematically illustrates an etching process of Comparative Example 2. In Comparative Example 2, plasma etching is performed by employing a mixed gas of a chlorine-containing gas ($Cl_2$) and a processing gas ($CF_4$ or $C_4F_8$). As illustrated in FIG. 3B, Cl radicals serve as an etchant for the first metal layer 7, the polysilicon layer 8 and the second metal layer 9 to perform anisotropic etching. On a side wall 8a of the polysilicon layer 8, a compound containing carbon (e.g., CF-based reaction products) is formed as a protective film. Accordingly, the side wall 8a of the polysilicon layer 8 is not etched by the Cl radicals and thus, its shape may be maintained. However, F radicals generated from $CF_4$ or $C_4F_8$ exist on the surface of the workpiece X. The F radicals serve as an isotropic etchant for a metal, and thus, etch the side wall of the tungsten layer 6 which constitutes the mask layer 3. Accordingly, the shape of the tungsten layer 6 becomes poor. Especially, the thickness of the tungsten layer 6 in the width direction is reduced, which is not in accordance with design values. The tungsten layer 6 included in the mask layer 3 is not a simple mask material for etching, but is a constitutional element for a device product. Thus, it is not preferable that the shape of the tungsten layer 6 becomes poor. As described above, when the plasma etching is performed by supplying the chlorine-containing gas ($Cl_2$) and the processing gas ($CF_4$ or $C_4F_8$), there is a problem in that an abnormal shape of the tungsten layer 6 occurs.

In contrast, in the plasma processing method and apparatus 10 according to the present exemplary embodiment, unlike in Comparative Examples 1 and 2, the abnormal shape may be suppressed. In the plasma processing method and apparatus according to the present exemplary embodiment, plasma etching is performed by employing a mixed gas of a chlorine-containing gas ($Cl_2$), a processing gas ($CF_4$ or $C_4F_8$) and a chloride-containing gas ($BCl_3$, $SiCl_4$ or HCl). As illustrated in FIG. 3C, Cl radicals serve as an etchant for the first metal layer 7, the polysilicon layer 8 and the second metal layer 9 to perform anisotropic etching. On a side wall 8a of the polysilicon layer 8, a compound containing carbon (e.g., CF-based reaction products) is formed as a protective film. Accordingly, the side wall 8a of the polysilicon layer 8 is not etched by the Cl radicals and thus its shape may be maintained. F radicals generated from $CF_4$ or $C_4F_8$ react with B, Si or H (for example, B in FIG. 3C) included in the chloride-containing gas and become volatile reaction products (compounds) to be exhausted. That is, by a so-called scavenging effect, the F radicals may be removed. Accordingly, the side wall of the tungsten layer 6 is not etched by the F radicals and thus its shape may be maintained.

As described above, in the plasma processing method and apparatus according to the present exemplary embodiment, while the first metal layer 7 and the polysilicon layer 8 are etched by chlorine radicals included in the chlorine-containing gas ($Cl_2$), the processing gas ($CF_4$ or $C_4F_8$) which contains carbon and fluorine may be introduced into the processing space S, thereby forming a product containing carbon as a protective film on the side wall of the polysilicon layer 8. This may suppress unnecessary etching of the polysilicon layer 8 in the horizontal direction. While the first metal layer 7 and the polysilicon layer 8 are etched, the chloride-containing gas ($BCl_3$, $SiCl_4$ or HCl) containing silicon, boron or hydrogen is introduced into the processing space S. Thus, during generation of the chlorine radicals, silicon, boron or hydrogen included in the chloride-containing gas may react with the fluorine radicals included in the processing gas. Accordingly, it is possible to suppress the fluorine radicals from etching the side wall of the tungsten layer included in the hard mask layer. In this manner, it is possible to maintain the shape of the mask while suppressing the shape abnormality of the material to be etched. Thus, it is possible to collectively perform etching under the same etching conditions while suppressing shape abnormality.

A preferred exemplary embodiment of the present disclosure has been described. However, the present disclosure is not limited thereto, and may be applied to others, and modifications may be made without departing from the scope of the claims.

For example, in the above described exemplary embodiment, two high frequency power sources are connected to a base 16 which constitutes a lower electrode, but a first high frequency power source may be connected to any one of the base 16 and an upper electrode 30, and a second high frequency power source may be connected to the other.

EXAMPLES

Hereinafter, Examples performed by the inventor will be described in order to describe the effect, but the present disclosure is not limited to Examples to be described.

(Evaluation of Shape Improvement Effect)

In Example 1, a plasma processing was performed by the plasma processing apparatus 10 illustrated in FIG. 1. As for a material to be etched, the configuration as illustrated in FIG. 2A was employed, and the first metal layer 7, the polysilicon layer 8 and the second metal layer 9 were sequentially etched under the same processing conditions so as to obtain the configuration as illustrated in FIG. 2B. The etching process in Example 1 was performed under the processing conditions as described below.

Example 1

Pressure of processing space S: 25 mTorr (3.33 Pa)
Power of first high frequency power source 62: 0 W
Power of second high frequency power source 64: 500 W (13 MHz)
Flow rate of mixed gas
$Cl_2$ gas: 30 sccm
$BCl_3$ gas: 50 sccm
$C_4F_8$ gas: 5 sccm Although power is applied only by the second high frequency power source 64 for bias attraction, the frequency is high, and thus plasma generation is possible.

In Comparative Example 1, only $Cl_2$ gas was supplied. Other conditions were the same as those in Example 1.

Comparative Example 1

Pressure of processing space S: 25 mTorr (3.33 Pa)
Power of first high frequency power source 62: 0 W
Power of second high frequency power source 64: 500 W (13 MHz)
Flow rate of mixed gas
$Cl_2$ gas: 80 sccm In Comparative Example 2, $Cl_2$ gas and $C_4F_8$ gas were supplied as a mixed gas. Other conditions were the same as those in Example 1.

Comparative Example 2

Figure 4:
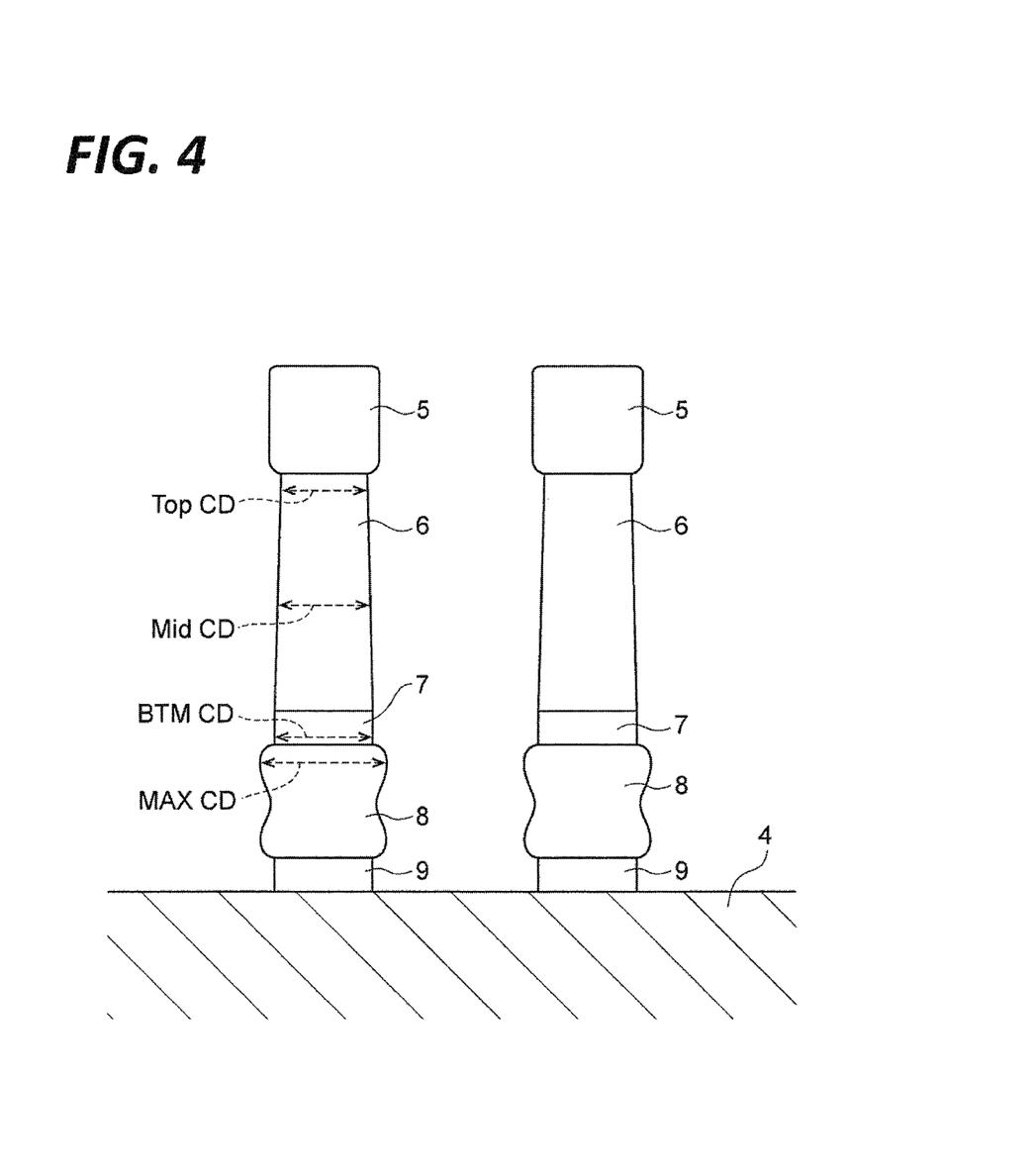
FIG. 4 is a view illustrating indicators on the shape of a multilayer film material.

Pressure of processing space S: 25 mTorr (3.33 Pa)
Power of first high frequency power source 62: 0 W
Power of second high frequency power source 64: 500 W (13 MHz)
Flow rate of mixed gas
$Cl_2$ gas: 80 sccm
$C_4F_8$ gas: 10 sccm The cross-section in each of Example 1 and Comparative Examples 1 and 2 which was obtained under the above described conditions was observed by a scanning electron microscope (SEM), and the shapes of the tungsten layer 6, the first metal layer (barrier metal layer) 7 and the polysilicon layer 8 were evaluated. FIG. 4 is a view illustrating indicators on shapes. As illustrated in FIG. 4, "Top CD" indicates a width of the upper end portion of the tungsten layer 6, which corresponds to a width in a transverse (horizontal) direction of the end portion side of the tungsten layer 6 in contact with the silicon oxide layer 5. "Mid CD" indicates a width of a transverse direction of a middle portion of the tungsten layer 6. Here, as an initial value, "Mid CD" of the tungsten layer 6 before etching was measured, and then "Mid CD" after etching was measured. Then, by a difference "ΔMid CD" therebetween, the shape of the tungsten layer 6 was evaluated. "Btm CD" indicates a width in the transverse direction of the lower end portion of the first metal layer 7. "MAX CD" indicates a maximum width in the transverse direction of the polysilicon layer 8. The difference between "MAX CD" and "Btm CD" was employed as an evaluation value of bowing to evaluate the shape of the polysilicon layer 8. The measurement results of Example 1 and Comparative Examples 1 and 2 are illustrated in FIG. 5.

Figure 5:
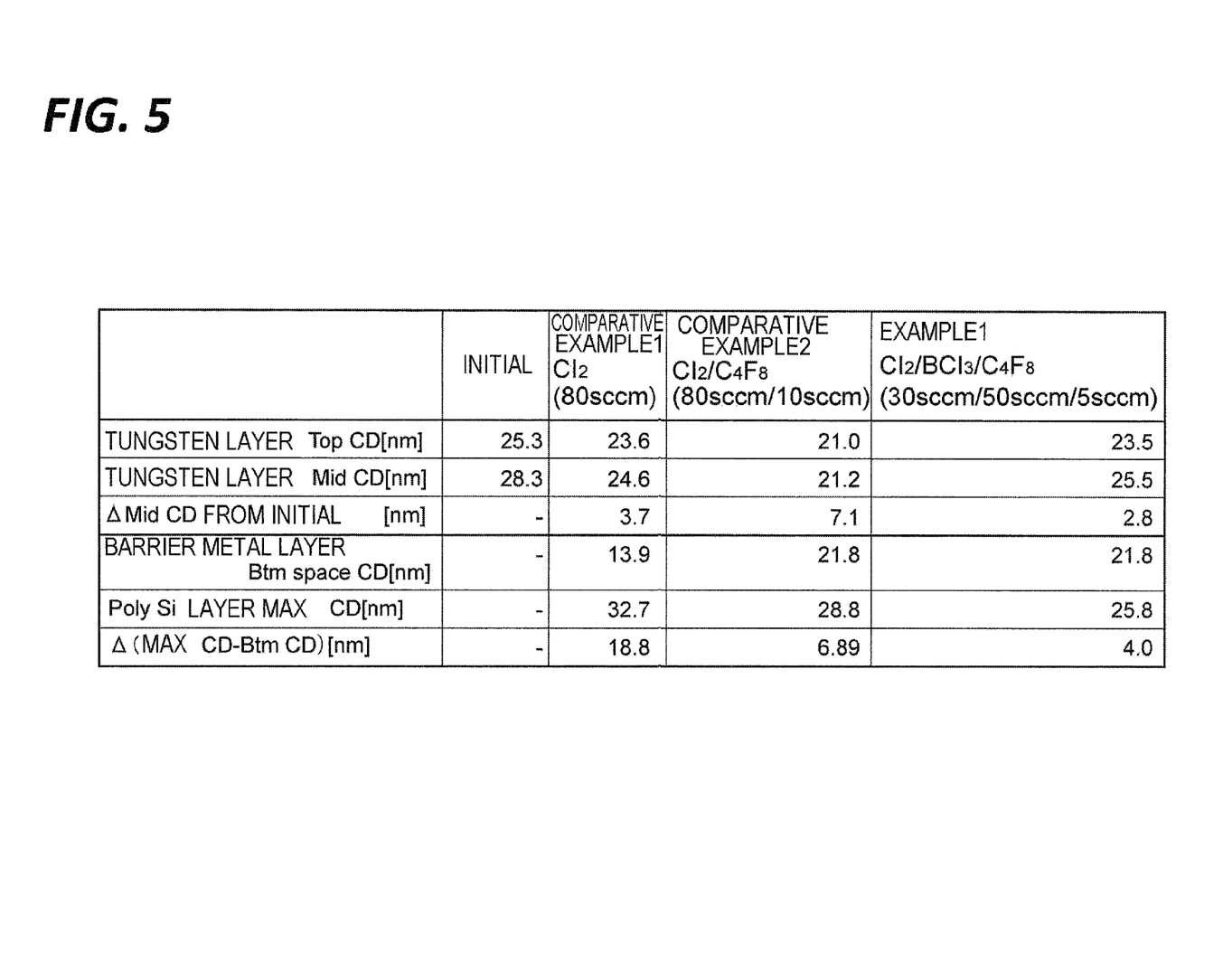
FIG. 5 illustrates a table of evaluation on shapes in Comparative Examples and Example.

FIG. 5 illustrates a table of measurement results in Example 1 and Comparative Examples 1 and 2. As illustrated in FIG. 5, in Comparative Example 1, "ΔMid CD" of the tungsten layer 6 was good (3.7 nm), but the evaluation value of bowing of the polysilicon layer 8 was large (18.8 nm). Meanwhile, in Comparative Example 2, the evaluation value of bowing of the polysilicon layer 8 was 6.89 nm. Thus, it was found that as compared to that in Comparative Example 1, the abnormal shape of the polysilicon layer 8 was suppressed because $C_4F_8$ gas was supplied. However, in Comparative Example 2, "ΔMid CD" of the tungsten layer 6 was 7.1 nm. Thus, it was found that as compared to that in Comparative Example 1, the abnormal shape of the tungsten layer 6 occurred due to supply of $C_4F_8$ gas. That is, from Comparative Examples 1 and 2, it was determined that the shape of the tungsten layer 6 and the shape of the polysilicon layer 8 have a trade-off relationship.

In contrast, in Example 1, "ΔMid CD" of the tungsten layer 6 was 2.8 nm, which was better than those of Comparative Examples 1 and 2. The evaluation value of bowing of the polysilicon layer 8 was 4.0 nm, which was better than those of Comparative Examples 1 and 2. Accordingly, it was determined that due to the mixed gas of $Cl_2$ gas, $BCl_3$ gas and $C_4F_8$ gas, both the shape of the tungsten layer 6 and the shape of the polysilicon layer 8 was good while the trade-off relationship was eliminated. That is, it was determined that it is possible to suppress the shape abnormality and to perform etching collectively under the same etching conditions.

(Confirmation of Gas Mixing Ratio Exhibiting Shape Improvement Effect)

Hereinafter, a gas mixing ratio which exhibits a shape improvement effect was confirmed by changing a mixing ratio of gases. In Example 2 to 4, the total flow rate of $Cl_2$ gas and $BCl_3$ gas was fixed as 80 sccm, and etching was performed by varying the flow rate ratio of $Cl_2$ gas or $BCl_3$ gas. Then, the shape was evaluated. In Examples 2 to 4, the following processing conditions were used, and other conditions were the same as those in Example 1. The flow rate ratio of $BCl_3$ gas mentioned in the processing conditions indicates $BCl_3$ gas flow rate/($BCl_3$ gas flow rate+$Cl_2$ gas flow rate)*100.

Example 2

Flow rate of mixed gas
$Cl_2$ gas: 50 sccm
$BCl_3$ gas: 30 sccm
$C_4F_8$ gas: 10 sccm
$BCl_3$ gas flow rate ratio=37.5%

Example 3

Flow rate of mixed gas
$Cl_2$ gas: 30 sccm
$BCl_3$ gas: 50 sccm
$C_4F_8$ gas: 10 sccm
$BCl_3$ gas flow rate ratio=62.5%

Example 4

Flow rate of mixed gas
$Cl_2$ gas: 30 sccm
$BCl_3$ gas: 50 sccm
$C_4F_8$ gas: 20 sccm
$BCl_3$ gas flow rate ratio=62.5%

In Comparative Example 3, a mixed gas of $Cl_2$ gas and $C_4F_8$ gas was supplied. Other conditions were the same as those in Examples 2 to 4.

Comparative Example 3

Flow rate of mixed gas
$Cl_2$ gas: 80 sccm
$BCl_3$ gas: 0 sccm
$C_4F_8$ gas: 10 sccm
$BCl_3$ gas flow rate ratio=0%

Figure 6:
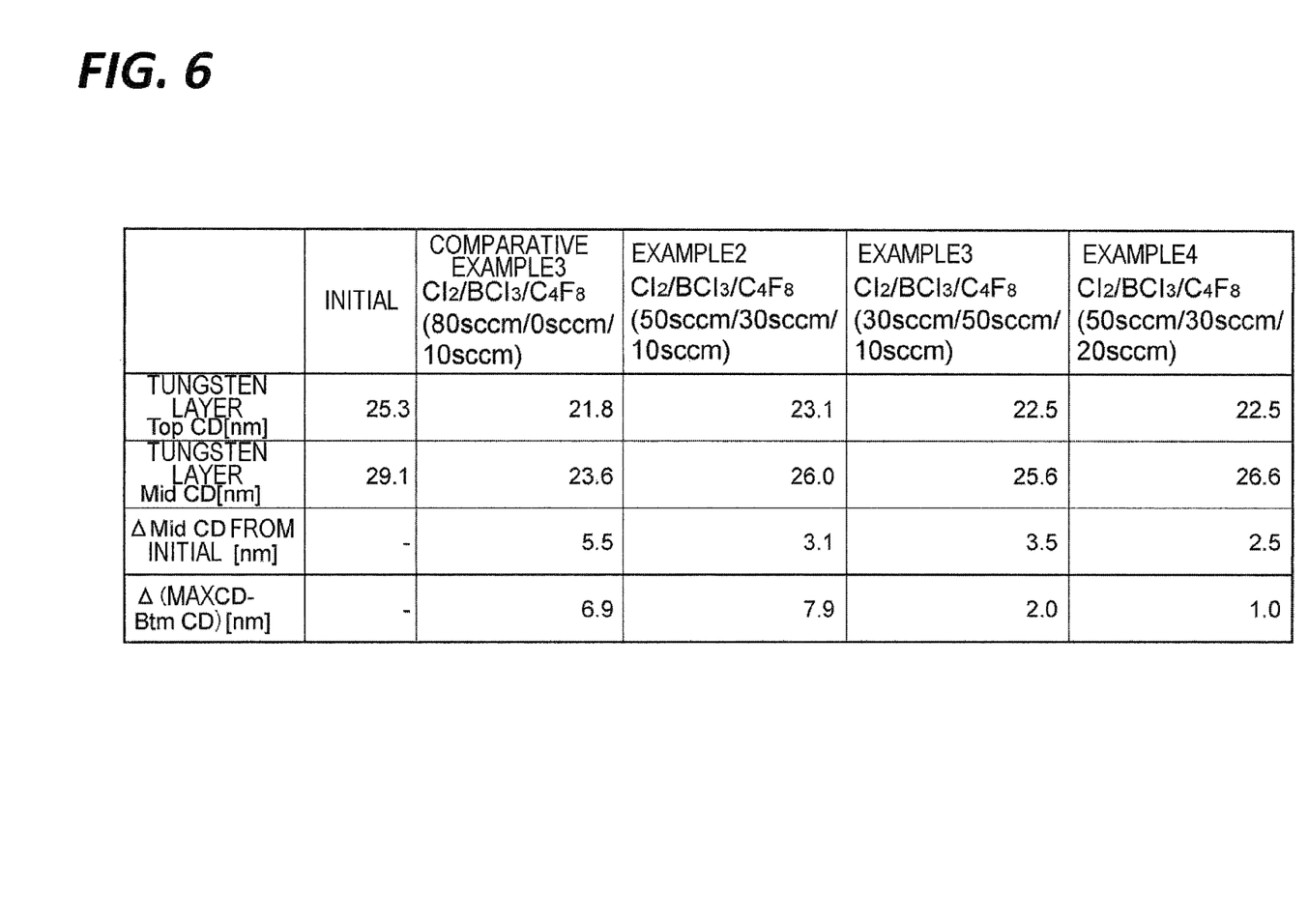
FIG. 6 illustrates a table of evaluation on shapes in Comparative Example and Examples.

FIG. 6 illustrates a table of measurement results in Examples 2 to 4 and Comparative Example 3. Meanwhile, initial "Mid CD" (before etching) was 29.1 nm. As illustrated in FIG. 6, in Comparative Example 3 ($BCl_3$ gas flow rate ratio 0%), the evaluation value of bowing of the polysilicon layer 8 was 6.9 nm, and "ΔMid CD" of the tungsten layer 6 was 5.5 nm. Meanwhile, in Example 2 ($BCl_3$ gas flow rate ratio 37.5%), the evaluation value of bowing of the polysilicon layer 8 was 7.9 nm, and "ΔMid CD" of the tungsten layer 6 was 3.1 nm. That is, it was determined that when the $BCl_3$ gas flow rate ratio was 37.5%, almost the same shape improvement effect as that exhibited by supply of $C_4F_8$ gas was obtained in the shape of the polysilicon layer 8, and the shape of the tungsten layer 6 was highly improved. In Example 3 ($BCl_3$ gas flow rate ratio 62.5%), the evaluation value of bowing of the polysilicon layer 8 was 2.0 nm, and "ΔMid CD" of the tungsten layer 6 was 3.5 nm. In Example 4 ($BCl_3$ gas flow rate ratio 62.5%), the evaluation value of bowing of the polysilicon layer 8 was 1.0 nm, and "ΔMid CD" of the tungsten layer 6 was 2.5 nm. As described above, it was determined that when the BCl$_3$ gas flow rate ratio ranges from 37.5 to 62.5%, the shape abnormality is suppressed up to almost the same extent.

Subsequently, the processing time was shortened as compared to those in Examples 2 to 4 and Comparative Example 3, and a gas mixing ratio which exhibits a shape improvement effect was confirmed by changing a mixing ratio of gases. In Examples 5 to 7, the total flow rate of Cl$_2$ gas and BCl$_3$ gas was fixed as 80 sccm, and etching was performed by varying the flow rate ratio of the Cl$_2$ gas or the BCl$_3$ gas. Then, the shape was evaluated. In Examples 5 to 7, the following processing conditions were used, and other conditions were the same as those in Example 1.

Example 5

Flow rate of mixed gas
Cl$_2$ gas: 50 sccm
BCl$_3$ gas: 30 sccm
C$_4$F$_8$ gas: 10 sccm
BCl$_3$ gas flow rate ratio=37.5%

Example 6

Flow rate of mixed gas
Cl$_2$ gas: 50 sccmB
Cl$_3$ gas: 30 sccm
C$_4$F$_8$ gas: 5 sccm
BCl$_3$ gas flow rate ratio=37.5%

Example 7

Flow rate of mixed gas
Cl$_2$ gas: 30 sccm
BCl$_3$ gas: 50 sccm
C$_4$F$_8$ gas: 5 sccm
BCl$_3$ gas flow rate ratio=62.5%

In Comparative Example 4, a mixed gas of Cl$_2$ gas and C$_4$F$_8$ gas was supplied. Other conditions were the same as those in Examples 5 to 7.

Comparative Example 4

Flow rate of mixed gas
Cl$_2$ gas: 80 sccm
BCl$_3$ gas: 0 sccm
C$_4$F$_8$ gas: 10 sccm
BCl$_3$ gas flow rate ratio=0%

Figure 7:
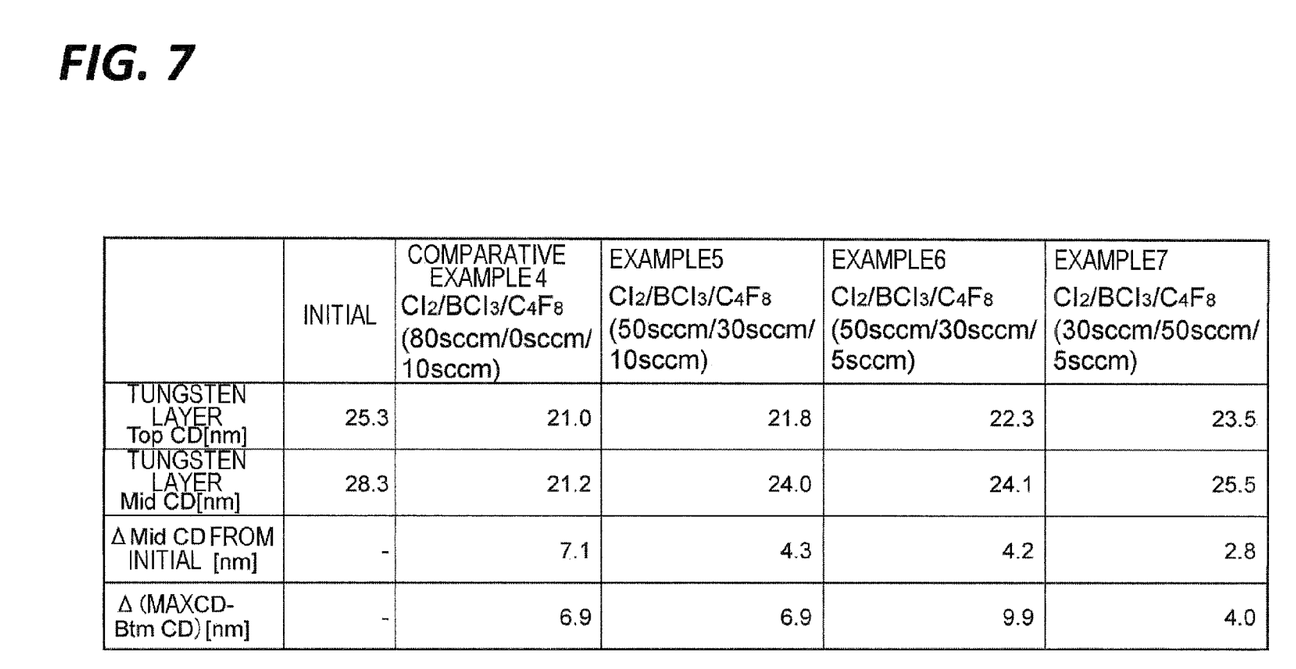
FIG. 7 illustrates a table of evaluation on shapes in Comparative Example and Examples.

FIG. 7 illustrates a table of measurement results in Examples 5 to 7 and Comparative Example 4. Meanwhile, initial "Mid CD" (before etching) was 28.3 nm. As illustrated in FIG. 7, in Comparative Example 4 (BCl$_3$ gas flow rate ratio 0%), the evaluation value of bowing of the polysilicon layer 8 was 6.9 nm, and "ΔMid CD" of the tungsten layer 6 was 7.1 nm. Meanwhile, in Example 5 (BCl$_3$ gas flow rate ratio 37.5%), the evaluation value of bowing of the polysilicon layer 8 was 6.9 nm, and "ΔMid CD" of the tungsten layer 6 was 4.3 nm. In Example 6 (BCl$_3$ gas flow rate ratio 37.5%), the evaluation value of bowing of the polysilicon layer 8 was 9.9 nm, and "ΔMid CD" of the tungsten layer 6 was 4.2 nm. In Example 7 (BCl$_3$ gas flow rate ratio 62.5%), the evaluation value of bowing of the polysilicon layer 8 was 4.0 nm, and "ΔMid CD" of the tungsten layer 6 was 2.8 nm. As described above, it was determined that when the BCl$_3$ gas flow rate ratio ranges from 37.5 to 62.5%, the shape abnormality is suppressed up to almost the same extent.

Then, a gas mixing ratio which exhibits a shape improvement effect was confirmed by further changing a mixing ratio of gases. In Examples 8 and 9, the total flow rate of Cl$_2$ gas and BCl$_3$ gas was fixed as 80 sccm, and etching was performed by varying the flow rate ratio of Cl$_2$ gas or BCl$_3$ gas. Then, the shape was evaluated. In Examples 8 and 9, the following processing conditions were used, and other conditions were the same as those in Example 1.

Example 8

Flow rate of mixed gas
Cl$_2$ gas: 60 sccm
BCl$_3$ gas: 20 sccm
C$_4$F$_8$ gas: 20 sccm
BCl$_3$ gas flow rate ratio=25.0%

Example 9

Flow rate of mixed gas
Cl$_2$ gas: 20 sccm
BCl$_3$ gas: 60 sccm
C$_4$F$_8$ gas: 20 sccm
BCl$_3$ gas flow rate ratio=75.0%

In Comparative Example 5, a mixed gas of Cl$_2$ gas and C$_4$F$_8$ gas was supplied. Other conditions were the same as those in Examples 5 to 7.

Comparative Example 5

Flow rate of mixed gas
Cl$_2$ gas: 80 sccm
BCl$_3$ gas: 0 sccm
C$_4$F$_8$ gas: 20 sccm
BCl$_3$ gas flow rate ratio=0%

Figure 8:
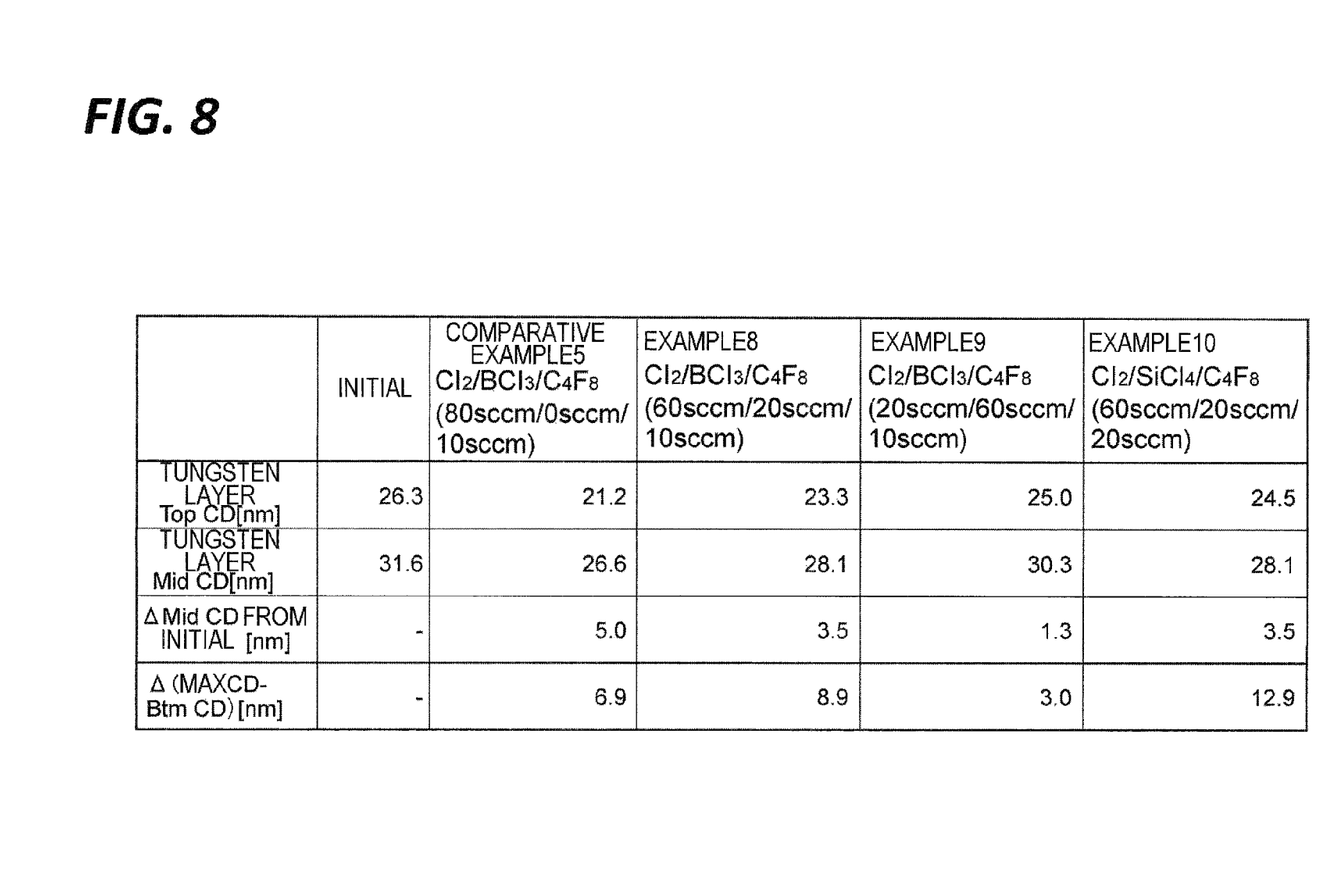
FIG. 8 illustrates a table of evaluation on shapes in Comparative Example and Examples.

FIG. 8 illustrates a table of measurement results in Examples 8 and 9 and Comparative Example 5. Meanwhile, initial "Mid CD" (before etching) was 31.6 nm. As illustrated in FIG. 8, in Comparative Example 5 (BCl$_3$ gas flow rate ratio 0%), the evaluation value of bowing of the polysilicon layer 8 was 6.9 nm, and "ΔMid CD" of the tungsten layer 6 was 5.0 nm. Meanwhile, in Example 8 (BCl$_3$ gas flow rate ratio 25.0%), the evaluation value of bowing of the polysilicon layer 8 was 8.9 nm, and "ΔMid CD" of the tungsten layer 6 was 3.5 nm. In Example 9 (BCl$_3$ gas flow rate ratio 75.0%), the evaluation value of bowing of the polysilicon layer 8 was 3.0 nm, and "ΔMid CD" of the tungsten layer 6 was 1.3 nm. That is, it was determined that even when the BCl$_3$ gas flow rate ratio ranges from 25.0 to 75.0%, the shape abnormality is suppressed up to almost the same extent. Meanwhile, the case where the BCl$_3$ gas flow rate ratio is greater than 75.0% was not evaluated because an etching rate is extremely reduced.

(Confirmation of Chloride-Containing Gas)

In Example 10, as for a chloride-containing gas, SiCl$_4$ gas was employed. The following processing conditions were used, and other conditions were the same as those in Example 1.

Example 10

Flow rate of mixed gas
Cl$_2$ gas: 60 sccm
SiCl$_4$ gas: 20 sccm

C$_4$F$_8$ gas: 20 sccm

SiCl$_4$ gas flow rate ratio=25.0%

The result of Example 10 is illustrated in FIG. 8. Meanwhile, initial "Mid CD" (before etching) was 31.6 nm. As illustrated in FIG. 8, in Example 10 (SiCl$_4$ gas flow rate ratio 25.0%), the evaluation value of bowing of the polysilicon layer 8 was 12.9 nm, and "ΔMid CD" of the tungsten layer 6 was 3.5 nm. That is, it was determined that even when SiCl$_4$ gas was employed, it is possible to collectively perform etching under the same etching conditions while suppressing shape abnormality as BCl$_3$ gas.

From the foregoing, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting, with the true scope and spirit being indicated by the following claims.

What is claimed is:

1. A plasma processing method comprising:

providing a multilayer film material in a processing container where the multilayer film material is formed with a polysilicon layer, a first metal layer formed on the polysilicon layer, and a hard mask layer containing a tungsten layer formed on the first metal layer with a predetermined pattern;

providing a mixed gas comprising: (a) a chloride-containing gas which includes a compound comprising: (1) a compound containing chlorine and silicon, (2) a compound containing chlorine and boron, or (3) a compound containing chlorine and hydrogen; (b) a chlorine-containing gas which contains chlorine; and (c) a processing gas which contains carbon and fluorine; and controlling a flow rate of each of the chloride-containing gas which includes a compound, the chlorine-containing gas which contains chlorine, and the processing gas; and generating plasma with the mixed gas and etching the multilayer film material from a top surface of the first metal layer to a bottom surface of the polysilicon layer with a same etching condition using the patterned hard mask layer as an etching mask.

2. The plasma processing method of claim 1, wherein the first metal layer contains titanium, titanium nitride or titanium silicide.

3. The plasma processing method of claim 1, wherein the chloride-containing gas which includes a compound contains at least one of BCl$_3$, SiCl$_4$ and HCl.

4. The plasma processing method of claim 1, wherein the processing gas contains at least one of CF$_4$ and C$_4$F$_8$.

5. The plasma processing method of claim 1, wherein the polysilicon layer is formed on a second metal layer.

6. The plasma processing method of claim 5, wherein the second metal layer contains titanium, titanium nitride or titanium silicide.

7. The plasma processing method of claim 1, wherein a flow rate of the chloride-containing gas which includes a compound is 75.0% or less with respect to a total flow rate of the chloride-containing gas which includes a compound and the chlorine-containing gas which contains chlorine.

8. The plasma processing method of claim 7, wherein a flow rate of the chloride-containing gas which includes a compound is 25.0% or more with respect to the total flow rate of the chloride-containing gas which includes a compound and the chlorine-containing gas which contains chlorine.

* * * * *